United States Patent [19]

Harr

[11] 4,050,086
[45] Sept. 20, 1977

[54] DYNAMIC TRANSDUCER BIASING SIGNAL AMPLIFYING CIRCUITRY

[75] Inventor: Jerome Danforth Harr, San Jose, Calif.

[73] Assignee: International Business Machines Corporation, Armonk, N.Y.

[21] Appl. No.: 684,053

[22] Filed: May 6, 1976

[51] Int. Cl.² .............................................. G11B 5/02
[52] U.S. Cl. ...................................... 360/66; 360/113
[58] Field of Search .................... 360/113, 66; 330/25, 330/27, 29

[56] References Cited

U.S. PATENT DOCUMENTS

| 3,806,828 | 4/1974 | Johnson | 360/66 |
|---|---|---|---|
| 3,852,813 | 12/1974 | Petersen | 360/66 |
| 3,979,775 | 9/1976 | Schwarz | 360/113 |

FOREIGN PATENT DOCUMENTS

| 643,108 | 6/1962 | Canada | 360/60 |
|---|---|---|---|

OTHER PUBLICATIONS

IBM Tech. Discl. Bulletin Apr. 1975 "Resistance Matching for Coupled-Film Magnetoresistive Elements" Lis & Volstyn vol. 17, No. 11, p. 3437.
IBM Tech. Discl. Bull. "Resistive Element for Bias & Noise Cancellation" Nepela & Potter p. 2759, vol. 17, No. 9.

Primary Examiner—Jay P. Lucas
Attorney, Agent, or Firm—George E. Roush

[57] ABSTRACT

The ideal response expected of an electromagnetic transducer, particularly of the Magneto-Resistive (M-R) type, obtains with signal translating circuitry for amplifying the varying signal produced and for dynamically biasing the transducer for maintaining the transducing operation in the linear portions of the characteristics of both the transducer and the amplifying circuitry. An M-R transducer is connected to the input circuit of alternating signal differential amplifying circuitry for delivering the desired signal at output terminals. The offset voltage across the transducer is compensated by differentially biasing input transistors of the amplifying circuitry. Biasing direct current through and/or voltage across the M-R transducer is controlled by a circuit connected to the output terminal and responsive to the signal thereat for developing a slowly inversely varying unidirectional voltage, preferably within a low pass filter interposed in the control circuit for stability. A current handling device, conveniently a transistor having the control voltage applied to a base electrode, is connected in series with the transducer for dynamically adjusting the unidirectional biasing current flowing therethrough.

14 Claims, 5 Drawing Figures

DYNAMIC TRANSDUCER BIASING SIGNAL AMPLIFYING CIRCUITRY

The invention relates to circuitry for amplifying a signal generated by and for simultaneously biasing an electromagnetic transducer, particularly, but not necessarily, of the Magneto-Resistive (M-R) type, in accordance with the signal generated.

The reproduction of electric signals stored in magnetic storage media by electromagnetic transducers is very well known. It is also very well known to control the gain of amplifying circuitry translating the reproduced signals by automatically acting circuitry dating back to the original invention of Harold Alden Wheeler in the 1920's.

Biasing of electromagnetic transducers for achieving better reproduction is also known. Typical of such biasing, and most appropo here, is the biasing of Magneto-Resistive (M-R) transducers. Such M-R transducers conventionally have a unidirectional current applied therethrough of value suitable for the best results obtainable from some viewpoint as decided by the artisan. This arrangement is frequently followed up by Automatic Gain Controlled (AGC) amplifying circuitry having some specially imparted characteristic, hopefully enhancing the reproduced signal.

An example of prior art M-R transducer biasing is given in U.S. Pat. No. 3,840,898, October 10, 1974, Bajorek et al.: 360/113. The closest example of which the Applicant is aware of a.g.c. circuitry superficially similar at first glance to the circuitry according to the invention is found in U.S. Pat. No. 3,723,894, March 3, 1973, Benenati: 330/29. Were the prior art biased M-R transducer and the teaching of Robert L. Benenati combined by one skilled in the art, the signal produced by the M-R head would not be enhanced in any way, but merely would be attenuated by the series circuit input PIN diode connection in the amplifier input circuitry. In addition, the attenuation is frequency (including noise frequency) sensitive since PIN diodes are attenuators of radio and higher frequency waves and/or impulses.

The objects indirectly referred to hereinafter and those that will appear as the specification progresses obtain in (non-attenuating) enhancing dynamic transducer biasing and signal amplifying circuitry arranged for controlling the characteristics of the transducer by adjusting the flow of biasing current inversely proportional to the output signal immediately through the transducer.

According to the invention a basic embodiment thereof comprises an electro-magnetic transducer of the type in which unidirectional biasing current is applied through the transducer for modifying the effect of magnetic flux cutting the transducer in generating the varying output signal. The unindirectional current is applied by way of series circuitry comprising a source of unidirectional voltage and/or current, the transducer itself, and a controllable substantially constant current adjusting circuit having control input terminals. The latter conveniently, and to a degree conventionally, is a semiconductor device, more frequently a transistor. The bias current input and the (same) signal output terminals are connected to amplifying circuitry of given characteristic from which an output signal voltage is taken. This amplifying circuitry in effect compensates the offset voltage across the transducer with an internally generated offset voltage. The output voltage is compared in a conventional comparing circuitry with steady state reference potential, filtered preferably by a low pass filter, and thereafter applied to the control input terminals of the control or current adjusting circuit.

In a more specific embodiment of the invention, the controllable current adjusting circuit is a transistor with the element between a collector or like output electrode and a common electrode connected in the series circuit and a control electrode connected to the control input terminals. More specifically the current adjusting circuit comprises a Darlington transistor combination having the collector electrodes connected to the transducer, the output emitter load connected to a common circuit resistor and the input base electrode connected with the common circuit resistor to the control input terminals.

The control voltage developing circuit preferably is a differential amplifier or comparator circuit having one input terminal connected to the output terminals of the amplifying circuitry and another input terminal connected to a point of fixed reference potential and having an output terminal at which a unidirectional voltage is delivered. Preferably, a long time constant resistance-capacitance or like filter circuit is interposed between the differential amplifier circuit output terminal and the control input terminals.

The offset voltage of the transducer is actually compensated for in the loop circuit, preferably, in differentially biasing input transistors of the amplifying circuitry.

The hereinbefore described functioning circuitry is incorporated in practical circuitry according to the invention for stable ideal output from an M-R or like transducer.

In order that all of the advantages of the invention fully obtain, preferred embodiments are described hereinafter, by way of examples only, with reference to the accompanying drawing forming a part of the specification and in which.

Figure 4A:
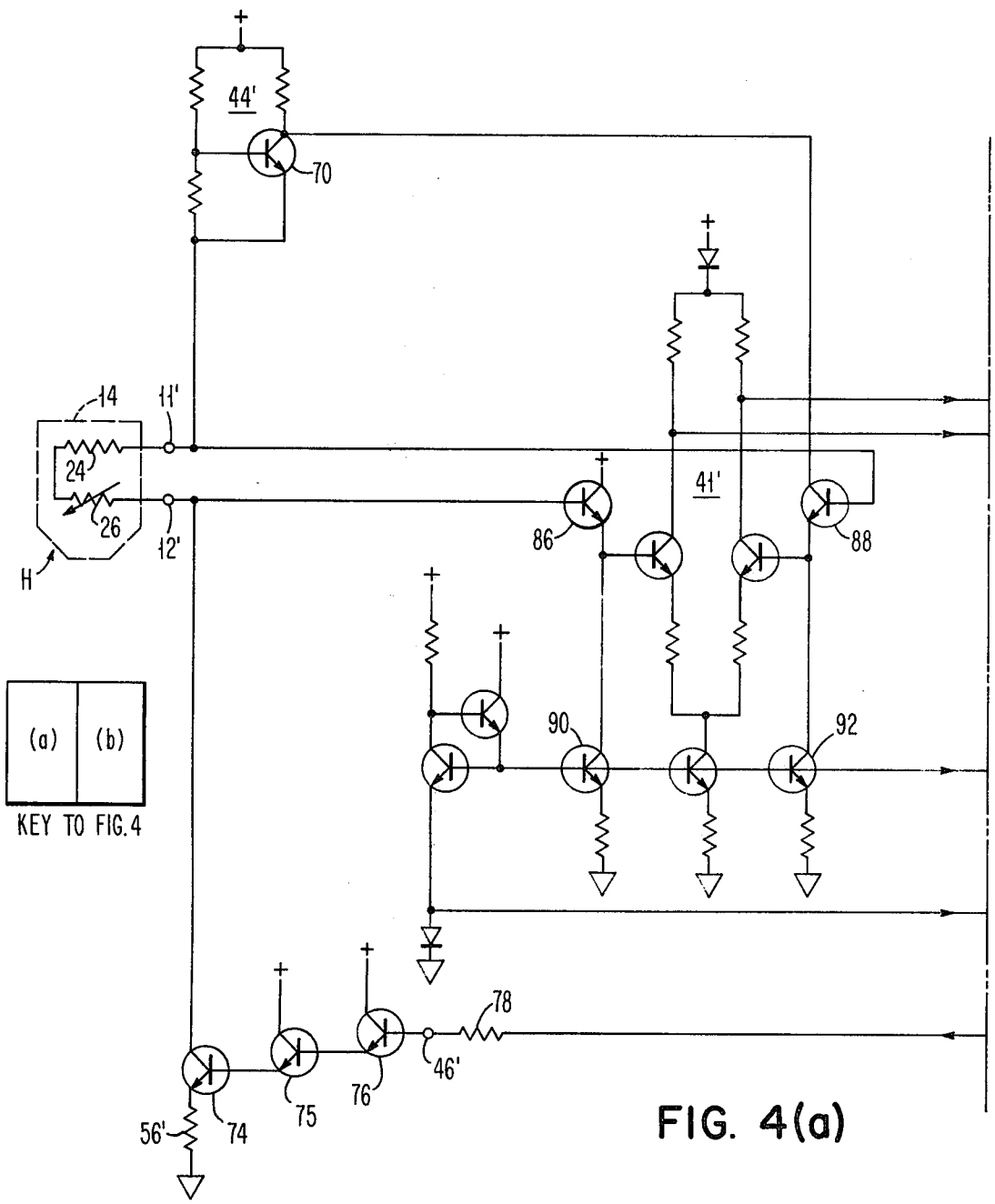
Figure 4B:
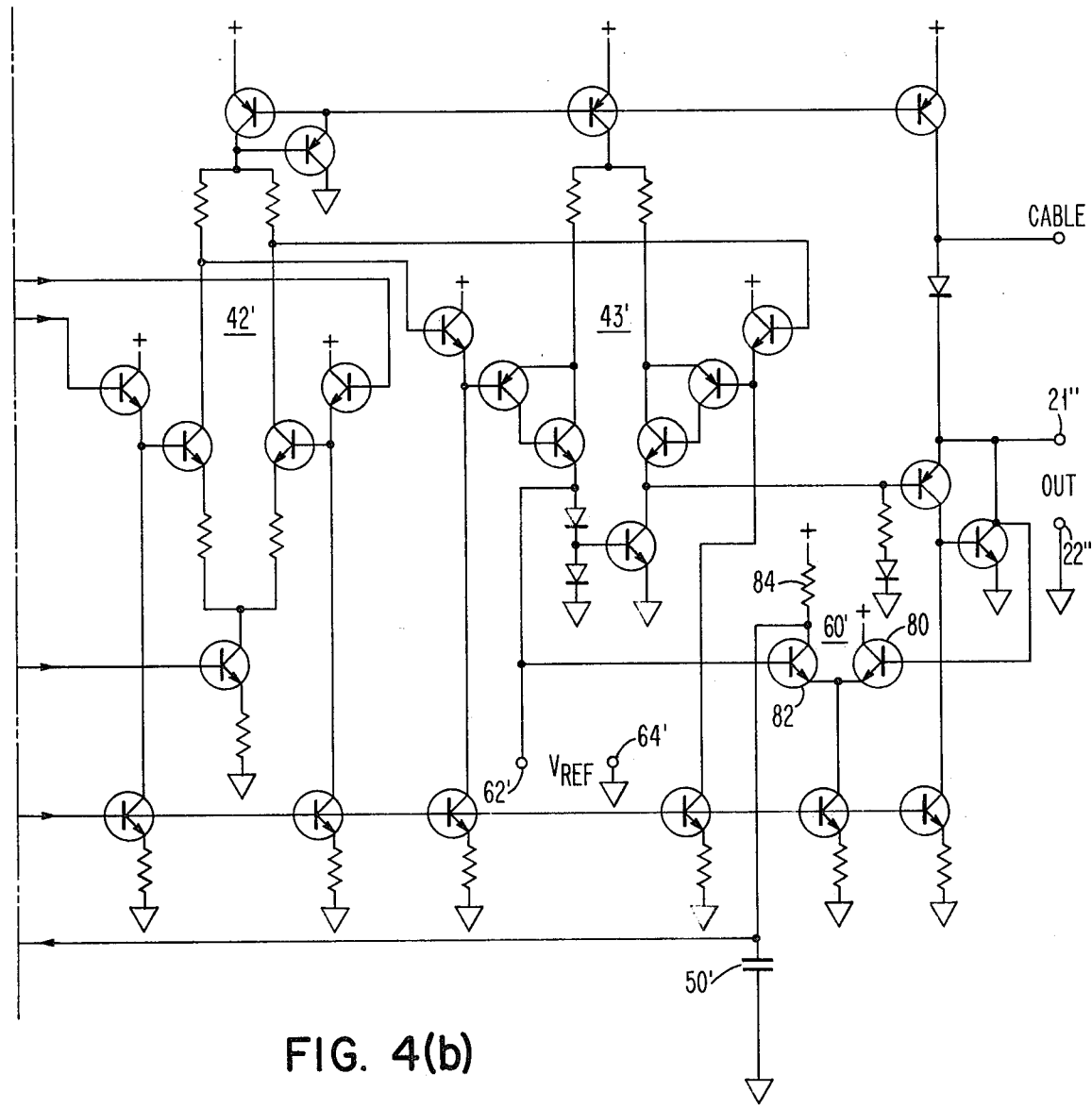

FIG. 4 — sections (a) and (b) being taken together — is a schematic diagram of a more practical embodiment of circuitry according to the invention.

Figure 1:
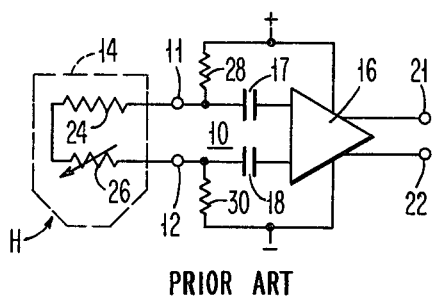
FIG. 1 is a schematic diagram summarizing the prior art circuitry for M-R and like transducers.

The pertinent prior art is effectively summarized schematically in the diagram of FIG. 1. The circuitry 10 comprises a pair of terminals 11, 12 serving as output terminals of an electromagnetic transducer, indicated broadly only by the dashed-line symbol 14 indicative of an electromagnetic transducer and as input terminals for the subsequent circuit comprising a differential amplifying circuit 16 coupled to the terminals 11, 12 by capacitors 17, 18. The signal generated by the transducer 14 appears in amplified form at output terminals 21, 22. The electromagnetic transducer 14 will be described hereinafter as a magneto-resistive (M-R) transducer in the interest of clarity, but it will be understood by those skilled in the art that any electromagnetic transducer requiring unidirectional current biasing may be used according to the following teaching. Additional details of a typical M-R transducer will be found in the above-mentioned U.S. Pat. No. 3,840,898 and also in U.S. Pat. No. 3,813,692 containing more detail. The diagram for the transducer 14 is that of a M-R transducer which is modeled by a bulk resistance, usually referred to as $R_B$, represented by a resistor 24, connected in series with a variable resistance element, usually referred to as $\Delta R$, represented by a resistance element 26, the resistance value of which varies with the magnetic field H, applied by the scanning of the transducer 14 over a magnetic storage medium in which the signals to be reproduced are stored. A unidirectional current is applied at the terminals 11, 12 for biasing the electromagnetic transducer 14 from a suitable source of direct current power, such as the same source as shown, which energizes the amplifying circuit 16.

The conventional amplifiers used with such M-R transducers, such as the combination shown, produce output signals that often vary as much as ±40%. At least one and usually two coupling capacitors are required. According to the invention, the signal variation can be reduced to ±11% as will be shown hereinafter.

The model of the electromagnetic transducer 14 shown comprises, for example, in a 75 μm M-R transducer, a bulk resistance, $R_B$, having a value varying by ±30% from unit to unit as manufactured by conventional means. The magnetic field responsive variable resistance element, $\Delta R$, which varies with the applied magnetic field. When the applied magnetic field is zero, $\Delta R$ is equal to zero. When the applied magnetic field is above a miniumum value needed to saturate the element, $$\Delta R = -kR_B \qquad (1)$$

where $k$ is a constant which varies between 0.020 and 0.025 from unit to unit in conventional manufacture. The direct current flowing through resistance elements 24 and 26 is set by the values of the resistors 28, 30 and the applied direct voltage. The alternating current or varying signal voltage that appears across the transducer when scanning is coupled into the amplifier circuit 16 by the capacitors 17, 18. Obviously, if the resistance of the bulk resistor 24 varies by ±30% and the value $k$ varies by ±11% from unit to unit, then the magnetically variable resistance of the resistor 26 will vary by roughly ±40%. With fixed bias current through the transducer, the ac signal voltage at the terminals 11, 12 brought about by the varying voltage drop across the magnetic-variable resistance element 26 varies by ±40%. It would be desirable to use 75 μm or 50 μm transducers, however, the latter have bulk resistances of approximately 24 ohms, ±30%. Use of this latter transducer with the amplifier 16 results in even worse signal variation.

However, the resistance value $\Delta R$ is about 2% of the value of the bulk resistance $R_B$. By adjusting the direct unipotential current $I_B$ flowing through the series resistance circuit of the electromagnetic transducer 14, it is possible to provide a predetermined voltage drop across the circuit at terminals 11, 12, whereby 98%, or almost all the resistance in the transducer, is the bulk resistance represented by the resistor 24.

Since $$V_{ac} = I_B \Delta R = k I_B R_B, \qquad (2)$$

if the unipotential current $I_B$ is varied in such a manner as to make the product of $I_B$ and $R_B$ a predetermined voltage, then the only variation in the signal is now due to the variation of the constant $k$, which has a tolerance of 11%.

As an example, a desired average voltage across the transducer 14 is 40 milivolts; the bulk resistance, $R_B$, of which is 26 ohms. Then according to the invention, the transducer bias current is adjusted to $$I_B = 0.040/26 = 1.54 \text{ ma.} \qquad (3)$$

Then the resulting alternating current or varying signal is $$V_{ac} = I_B \Delta R = k I_B R_B = 1.54 \, k \text{ max} 26 \text{ ohms} \qquad (4)$$

$$= k \times 40 \text{ milivolts.} \qquad (5)$$

For a different transducer with $R_B = 46$ ohms to be connected to the terminals 11, 12, the bias current is readjusted so that $$I_B R_B = 40 \text{ millivolts, and } I_B = 0.040/46 = 0.87 \text{ ma.} \qquad (6)$$

the resulting varying output signal is $$V_{ac} = I_B \Delta R = k(0.87)(46) = k \times 40 \text{ millivolts.} \qquad (7)$$

According to the invention, by adjusting the bias current in this manner, the only output signal variation remaining is a variation due to a constant, $k$; the large variation in the bulk resistance element is compensated through the change in bias current.

Figure 2:
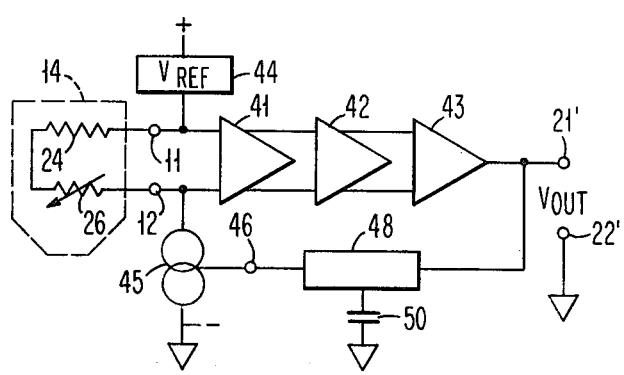
FIG. 2 is a functional diagram of basic circuitry according to the invention.

FIG. 2 is a functional diagram of circuitry according to the invention for automatically biasing the transducer. Amplifying circuitry, comprising differential amplifier circuits 41, 42 and 43 connected directly in cascade is arranged between the input terminals 11, 12 and the output terminals 21', 22'. Unidirectional biasing current is applied at terminals 11, 12 by a series circuit comprising reference voltage establishing means 44 and a substantially constant current generating circuit 45 having a control terminal 46 enabling the variation of the biasing current through the resistance elements 24 and 26 as desired. The control voltage applied at terminal 46 is derived from the output terminals 21' of the amplifying circuitry by means of a control current generating circuit 48. Preferably, the control current developed by the circuit 48 is smooth so that the developed variation required is considerably slower than the variations in the varying output signal at the terminals 21', 22'. An example of means for such smoothing is shown as an exemplary capacitor 50. Thus, the d.c. voltage level at the output of the amplifying circuitry forms an essential component in the development of a control current for varying the unidirectional bias current through the electromagnetic transducer 14 for improving the response of the transducer and also maintaining the varying output signal in the linear portion of the characteristic of the amplifying circuit, or such other predetermined characteristic of the amplifier circuitry as desired for the application at hand.

Figure 3:
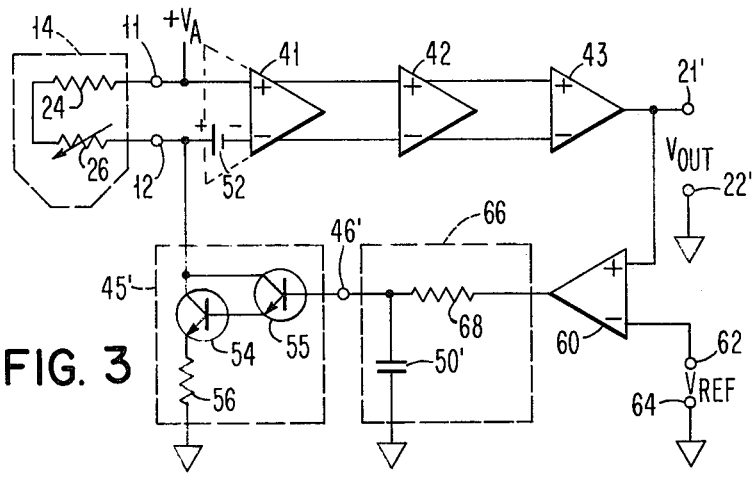
FIG. 3 is a schematic diagram of circuitry according to the invention.

FIG. 3 is a schematic diagram of simple electronic circuitry for adjusting the bias current automatically. Like reference numerals indicate closely similar electronic circuitry. For explanatory purposes, a cell 52 or a battery of value substantially equal to the value of offset voltage, $V_{OS}$, is shown in the input circuit of the first amplifier circuit 41. The unidirectional bias current is applied through terminal 11, the bulk resistance element 24, the magnetically varying resistance element 26, the terminal 12, the collector emitter circuit of a semiconductor device shown here as a Darlington combination of transistors 54, 55 and an emitter resistor 56. Control voltage for deriving the control current is developed by means of a differential amplifier circuit 60 serving as a comparator circuit connected to the varying signal output terminals 21' and a source of fixed reference voltage potential at terminals 62, 64. The output terminal of the amplifier circuit 60 is applied to the control input terminal 46' by way of a low-pass filter circuit 66, shown here as comprising a series resistor 68 and a shunt capacitor 50'. In operation, the amplifier circuit 41 compares the voltage across the terminals 11, 12 to the offset voltage represented by the cell 52 and amplifies the difference. This difference, $V_{M-R} - V_{OS}$ is further amplified by the amplifiers 42 and 43 and is delivered to the output terminals 21', 22'. This amplified voltage is compared with or referred to the fixed reference voltage and also amplified by the amplifier circuit 60. The resulting voltage at the output of the amplifier, comparator circuit 60 directly controls the bias current through the transducer 14. The feedback network acts to keep the differential input voltage to the initial amplifier circuit 41 very low. This is accomplished, in the circuit according to the invention, by adjusting the unidirectional bias current through the resistance elements 24 and 26 to render the voltage drop of the transducer at the terminals 11, 12 equal to the offset voltage represented by the cell 52. For an example of offset voltage of 0.040 volts, the bias current $I_B$ is adjusted by the feedback network to 1.5 ma for a 26 ohm transducer. Similarly, the bias current will be 1.11 ma for a 36 ohm transducer and 0.87 ma for a 46 ohm transducer. In all three cases, the varying output signal across the transducer at terminals 11, 12 will be $k \times 40$ millivolts, or 0.9 millivolts $\pm 11\%$. The amplifier circuits 41 . . . 42 are directly coupled to the transducer, thereby eliminating the need for and the adverse effect of the conventional coupling capacitors. This is brought about by the manner in which the feedback network is arranged to establish the unidirectional operating point for the amplifier chain.

FIG. 4 is a substantially complete schematic diagram for an actual circuit constructed on a single semiconductor chip and tested in practice. Closely similar circuitry is indicated by like reference numerals and circuits differing to some extent but still essentially similar are indicated by primed reference numerals. The steady state voltage indicated previously by the circuit 44 is developed here in a circuit 44' having a transistor 70 and three associated resistors. Three cascaded transistors 74, 75 and 76 constitute the control circuit 45'. The comparator-amplifier circuit 60' comprises transistors 80 and 82, the latter having a load resistor 84. The output voltage across the load resistor 84. The output voltage across the load resistor 84 is applied through the resistor 78' to the control input terminal 46'. The voltage control current source is made up of transistors 74, 75 and 76 as described. The resistor 78 serves principally to limit the current through the latter transistors when the power is removed. A capacitor 50' forms a R-C filter combination with the load resistor 84. Values chosen result in a period of 4 seconds corresponding to 0.04 Hz. The high impedances of the collector circuit of the transistor 82, render the filter circuit described. The offset voltage $V_{OS}$, is generated by biasing two input transistors 86 and 88 with different emitter currents. Two current source transistors 90 and 92 provide current of 52 μa and 230 μa respectively to the two input transistors, which cause them to have different base to emitter, $V_{be}$, drops. The difference in these drops is 38.5 millivolts, which value is the offset voltage for the circuit shown.

While the invention has been shown and described with reference to specific embodiments thereof, it should be understood that those skilled in the art will make changes without departing from the spirit and scope of the invention as defined in the appended claims concluding the specification.

The invention claimed is:

1. Dynamic transducer biasing signal amplifying circuitry for translating a signal generated in an electromagnetic transducer having two terminals across which direct biasing current is applied and a unidirectional output voltage having a component of offset voltage and a component of varying output voltage signal is delivered, comprising
    a pair of input terminals between which said electromagnetic transducer is connected,
    differential translating circuitry having input terminals individually connected to said pair of input terminals and having output terminals at which an output voltage proportional to said varying output voltage signal is delivered,
    said translating circuitry being arranged for developing internally thereof an offset voltage substantially equal to said offset voltage of said transducer and
    control circuitry having an input circuit connected between one of said output terminals and a point of fixed reference potential and having an output circuit connected to said input terminals for developing a direct voltage proportional to said output voltage for biasing said electromagnetic transducer.

2. Dynamic transducer biasing signal amplifying circuitry as defined in claim 1 and wherein
    said control circuitry is arranged for developing said biasing voltage at which said transducer is operated over a substantially linear range.

3. Dynamic transducer biasing signal amplifying circuitry as defined in claim 2 and wherein
    said translating circuitry is operated over a substantially linear range.

4. Dynamic transducer biasing signal amplifying circuitry as defined in claim 1 and wherein
    said differential translating circuitry comprises
    two input transistors connected in signal translating circuitry wherein the base-to-emitter junctions are mismatched for compensating for said offset voltage.

5. Dynamic transducer biasing signal amplifying circuitry as defined in claim 4 and wherein
    said translating and said control circuitry is arranged for substantially compensating for thermal drift of said translating circuitry due to said mismatch of said input transistors.

6. Dynamic transducer biasing signal amplifying circuitry for translating a signal generated in an electromagnetic transducer having two terminals across which direct biasing current is applied and a varying output signal is delivered, comprising
    a pair of input terminals between which said electromagnetic transducer is connected,
    differential amplifying circuitry having differential input terminals individually connected to said pair of input terminals and having a pair of output terminals at which said varying output signal is delivered, a differential amplifying circuit having one input terminal connected to an output terminal of said amplifying circuitry, having another input terminal connected to a point of fixed reference potential and having an output terminal, control circuitry having two-terminal direct current carrying circuitry connected in series with said pair of input terminals and having a control terminal, and circuitry coupling said control terminal to said output terminal of said differential amplifying circuit.

7. Dynamic transducer biasing signal amplifying circuitry as defined in claim 6 and wherein
said filter circuit comprises
the high impedance component of the collector circuit of said differential amplifying circuit, and
a capacitor connected between said collector circuit and a point of fixed reference potential.

8. Dynamic transducer biasing signal amplifying circuitry as defined in claim 6 and wherein
said control coupling circuitry comprises
a low pass filter circuit having a relatively low cutoff frequency.

9. Dynamic transducer biasing signal amplifying circuitry as defined in claim 8 and wherein
said cutoff frequency is of the order of 0.05 Hertz and lower.

10. Dynamic transducer biasing signal amplifying circuitry as defined in claim 6 and wherein
said control circuitry comprises
a transistor having a collector electrode connected to one of said input terminals, a base electrode connected to said control terminal and an emitter electrode,
a resistor having one terminal connected to said emitter electrode and having another terminal,
circuitry for applying direct energizing potential between the other of said input terminals and the other terminal of said resistor.

11. Dynamic transducer biasing signal amplifying circuitry as defined in claim 10 and incorporating
another transistor interposed between the first said transistor and said control terminal.

12. Dynamic transducer biasing and signal amplifying circuitry comprising
an electromagnetic transducer having a pair of terminals for biasing the transducer and for delivering an output signal,
a unidirectional current carrying circuit comprising said transducer, a source of unidirectional current and a controllable constant current adjusting device all connected in series and said device having at least one control terminal,
amplifying circuitry connected to said transducer and having output terminals for delivering an amplified output signal,
a control current generating circuit having an input terminal connected to said output terminals of said amplifying circuitry and an output terminal connected to said control terminal of said device, and
offset voltage compensating circuitry interposed in a feedback loop comprising said amplifying circuitry, said control current generating circuit and said unidirectional current carrying circuit.

13. Dynamic transducer biasing signal amplifying circuitry for transducing magnetic flux manifesting recorded information into an electric signal comprising:
bias circuitry for supplying an adjustable amplitude direct bias voltage;
an electromagnetic transducer connected to said bias circuitry and exhibiting a resistance variation as a function of intercepted magnetic flux and delivering a varying output signal which is a function of the bias voltage and the intercepted magnetic flux;
translating circuitry connected to said transducer for developing an output signal representing changes in the average value of the output signal of said transducer; and
closed feedback loop circuitry interconnecting said translating circuitry and said bias circuitry for adjusting the bias voltage amplitude as a function of the signal for maintaining the output of said transducer at a predetermined constant average value.

14. Dynamic transducer biasing signal amplifying circuitry, comprising;
a source of magnetic flux manifesting recorded information;
bias circuitry for suplying direct bias voltage having an adjustable amplitude;
an electromagnetic transducer exhibiting a magnetoresistive effect intercepted by said magnetic flux, connected with a pair of impedance elements having a bias signal input connected to said bias circuitry and a signal output which is a function of the bias signal and the intercepted magnetic flux;
translating circuitry connected to the said transducer for supplying an output signal representing changes in the average value of said transducer signal output; and
closed feedback loop circuitry interconnecting said translating circuitry and said bias circuitry for adjusting the bais voltage amplitude as a function of the output of said translating circuitry for maintaining the transducer signal output at a predetermined constant average value.

* * * * *